United States Patent [19]

Takahashi

[11] Patent Number: 5,896,257
[45] Date of Patent: Apr. 20, 1999

[54] TWO SENSOR FOR OVER-CURRENT PROTECTION AND CURRENT SENSING CONFIGURATION MOTOR CONTROL

[75] Inventor: Toshio Takahashi, Rancho Palos Verdes, Calif.

[73] Assignee: Allen-Bradley Company, LLC, Milwaukee, Wis.

[21] Appl. No.: 08/953,084

[22] Filed: Oct. 17, 1997

[51] Int. Cl.$^6$ .................................................. H02H 5/04
[52] U.S. Cl. .................... 361/31; 361/87; 361/93; 361/23
[58] Field of Search ......................... 361/23, 31, 42, 361/49, 78, 87, 93

[56] References Cited

U.S. PATENT DOCUMENTS 3,955,121  5/1976  Vahey ............................................. 361/31
4,683,513  7/1987  Miller ............................................. 361/76
4,896,242  1/1990  Neft ............................................... 361/87
5,705,909  1/1998  Rajashekara .................................. 318/801

*Primary Examiner*—Jeffrey Gaffin
*Assistant Examiner*—Kim Huynh
*Attorney, Agent, or Firm*—Michael A. Jaskolski; John J. Horn; John M. Miller

[57] ABSTRACT

An apparatus including only first and second sensors for determining three phase motor currents and providing complete over-current protection to a three phase motor having three input lines. The first and second sensors measure first and second combined currents wherein the first combined current is the current through the first and second lines and the second combined current is at least the current through the second line and at least one of the first or second combined currents include the third current. The first and second combined currents are used to provide the over-current protection and are used to determine all of the first, second and third line currents.

13 Claims, 2 Drawing Sheets

TWO SENSOR FOR OVER-CURRENT PROTECTION AND CURRENT SENSING CONFIGURATION MOTOR CONTROL

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention relates to motor controls and more particularly to a two current sensor assembly for determining three phase current values and for providing over-current protection.

Many motors include three phase windings driven by a controller which provides three phase AC currents to the three windings via three separate AC supply lines. To provide controlled operation, many control systems include closed loop current feedback so that motor operation can be monitored and adjusted accordingly.

In addition, many systems come equipped with over-current protection circuitry to minimize the effects of short circuited supply lines. To this end, over-current protection circuitry typically includes a means for monitoring all three line currents and means for shutting off the line currents when a current irregularity is identified. When one of the line currents exceeds a predetermined threshold value, the circuitry recognizes the possibility of a short and shuts off current to all three motor phases effectively stopping the motor until the cause of the irregularity is identified.

The easiest way to provide current feedback for both motor control and over-current protection is to provide three current sensors, a separate sensor on each of the three supply lines. Currents sensed via the three sensors is provided to the over-current protection circuitry and the controller generally to facilitate over-current protection and motor control, respectively.

Typical current sensors used in the motor controls art include Hall effect sensors. A Hall effect sensor typically forms a passageway through which one or more lines can be passed. The sensor senses the total current passing through the passageway and provides an electrical signal indicative thereof.

While the three sensor solution is robust and easy to understand, unfortunately current sensors are relatively expensive. Therefore, it is desirable to use fewer than three sensors when possible.

To this end, some systems have been designed which are capable of measuring two line currents and deriving the third line current therefrom. It is well known that the sum of currents passing through the three supply lines should equal zero. Thus, if the first and second line currents are sensed, during normal operation the third line current can be determined by taking the negative of the sum of the first and second currents. Here, all three line currents can be derived for control purposes using only two Hall effect sensors.

Unfortunately, where only two line currents are measured and the third current is derived, the derived current may not reflect a fault to ground in the third line. This is because a connection to ground in the third line with a relatively high impedance may not significantly affect the currents in the first and second lines.

If a short occurs in a third line and is not detected because the third line current is derived via the first and second sensed currents, the over-current circuitry cannot operate properly to shut off current to the three phases and motor damage or operator injury may result.

Thus, it would be advantageous to have a current sensing apparatus wherein all currents in a three phase motor system can be derived using less than three current sensors and complete over-current protection can also be provided via the sensed currents.

BRIEF SUMMARY OF THE INVENTION

The present invention includes an apparatus including only two current sensors which can be used to derive three line currents and which also provides sensed signals which reflect over-current conditions on any of the three lines of a motor control system.

To this end, the inventive system includes an apparatus for measuring currents provided to a three phase motor including first, second and third input lines, each input line linked to a separate one of three motor phases. The apparatus includes a first sensor for sensing a first combined current, a second sensor for sensing a second combined current and a calculator using the first and second combined currents to determine first, second and third line currents flowing through the first, second and third lines, respectively. Each of the three line currents is included in at least one of the combined currents, the first combined current can be used independently to identify one of the first, second, or third line currents and the second combined current can be used independently to identify another of the first, second, or third line currents.

A primary object of the invention is to provide a current sensing apparatus which provides all three line currents. By configuring the first sensor such that one of the line currents can be derived solely using the signal from the first sensor and configuring the second sensor such that another of the line currents can be derived solely using the signal from the second sensor, the third line current can be derived from the two "sensed" currents. This is because, as all of the line current must add up to zero at any instant in time, the third line current is the negative of the sum of the first and second currents.

Another object of the invention is to derive all three line currents inexpensively. This is accomplished as only two instead of three sensors are employed.

In one aspect, the first combined current only includes the first and second line currents, the second combined current includes only the second and third line currents and the calculator equates the first line current with the negative of the second combined current, equates the third line current with the negative of the first combined current and derives the second line current by taking the negative of the sum of the first and third line currents.

Preferably the apparatus also provides full over-current protection for the motor system. To this end, the calculator further includes a rectifier and a comparator, the rectifier receives the first, second and third line currents, converts the currents to a DC current value, the comparator compares the DC current value to a threshold value and generates an alarm signal when the DC current value amplitude exceeds the threshold value, the threshold value being a predetermined percentage in excess of a steady state DC current value.

One other object is to provide complete over-current and ground fault protection for all three supply lines despite employing only two current sensors. To this end, each of the three supply lines is configured such that the current therethrough is sensed by at least one of the first or second sensors. Thus, although only two combined currents are provided by the first and second sensors, the combined currents reflect the actual values of all three line currents. For example, the first sensor may sense current through the first and second lines while the second sensor may sense currents through the second and third lines. In this case, the first combined current can be independently used to determine the third line current while the second combined current can be independently used to determine the first line current. The second line current can be derived from the first and third as well known in the art. In addition, any irregularity in any of the line currents due to a short circuit to ground will be reflected in either the first or second combined currents.

In one embodiment, when an alarm signal is generated, an over-current protection mechanism shuts off the currents to the motor to avoid damage to the motor or injury.

Other sensor embodiments are contemplated by the invention, the important aspects of each embodiment being that each of the line currents is sensed by at least one of the first and second sensors and that one of the line currents can be derived solely using the signal from the first sensor while another of the line currents can be derived solely using the signal from the second sensor.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefor, to the claims herein for interpreting the scope of the invention.

DETAILED DESCRIPTION OF THE INVENTION

Figure 1:
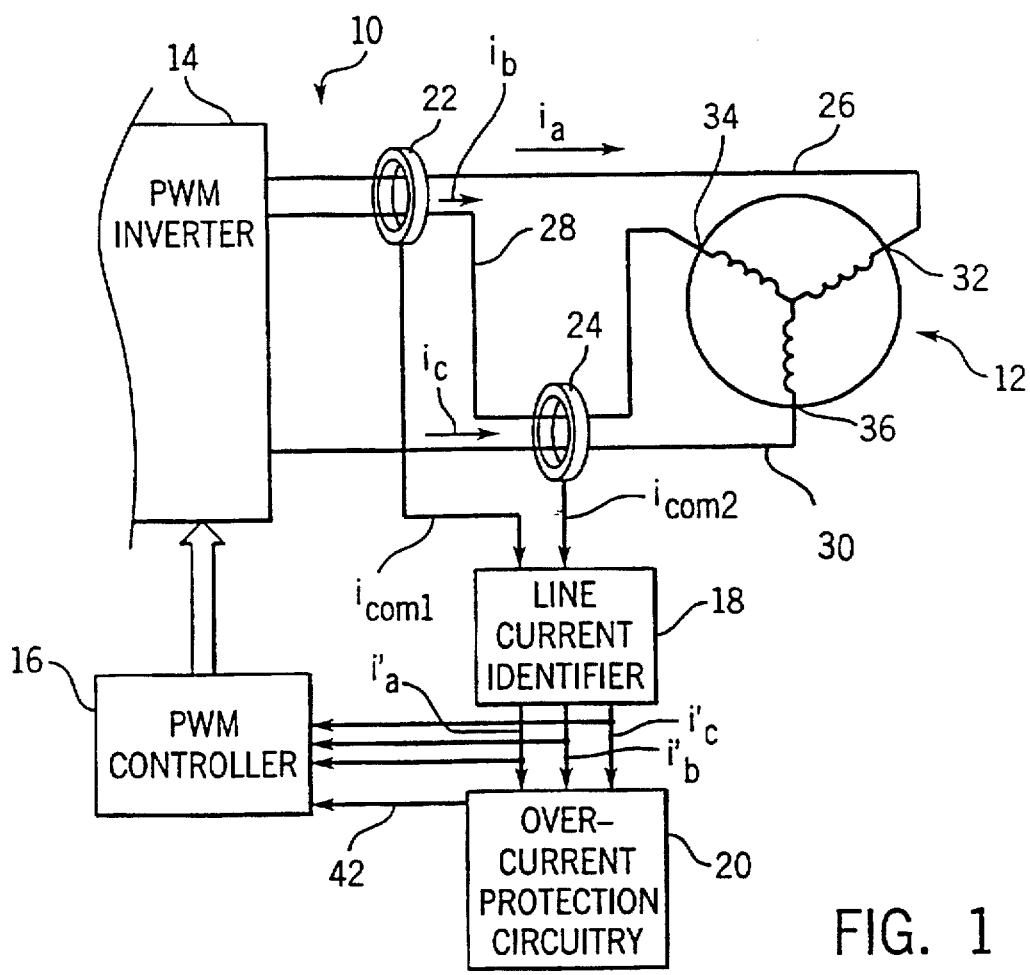
FIG. 1 is a schematic diagram illustrating the inventive sensor configuration in a typical motor control environment.

Referring now to the drawings, where like reference characters represent corresponding elements throughout the several views, and more specifically referring to FIG. 1, the present invention will be described in the context of an exemplary PWM control configuration referred to herein generally as control 10. Control 10 is used to drive a motor 12 or any other three phase load and includes a pulse width modulating (PWM) inverter 14, a PWM controller 16, a line current identifier 18, over-current protection circuitry 20 and first and second current sensors 22, 24, respectively, which typically are Hall effect sensors.

As well known in the art, inverter 14 consists of three pairs of switches, each switch pair including series arranged upper and lower switches configured between positive and negative DC power supplies. Each pair of switches is linked to a unique load terminal 32, 34, or 36, by a unique supply line 26, 28, or 30, each supply line connected to a node between an associated pair of switches. Each series arranged pair of switches is controlled so as to alternately connect an associated stator winding (e.g. an associated terminal 32, 34, or 36) between the positive and negative DC power supplies to produce a series of high frequency voltage pulses at the terminals 32, 34 and 36. By controlling the switches so as to change the average of the high frequency voltage pulses over a period, a fundamental low frequency alternating line-to-line voltage between motor terminals can be provided which drives the motor. Controller 16 provides firing pulses which turn inverter switches on and off thereby providing the high frequency voltage pulses at terminals 32, 34 and 36. Also, as well known in the art, controller 16 typically receives three reference or modulating signals in the triangle carrier signal, compares each modulating signal to the carrier signal and generates firing signals consisting of a plurality of pulses corresponding to each modulating signal. When a modulating signal has a greater instantaneous amplitude than a carrier signal, the corresponding firing signal is high producing a pulse on time. When a modulating signal has a instantaneous amplitude that is less than the carrier signal, the corresponding firing signal is low producing a pulse off time. The firing signals are provided to inverter 14 thereby providing desired currents $i_a$, $i_b$, $i_c$, on lines 26, 28 and 30. In addition to comparing the triangle and modulating waves, for the purposes of this explanation it will be assumed that controller 16 also includes circuitry which can adjust the modulating wave as a function of feedback currents which indicate actual operation of motor 12. This type current feedback control is well known in the art and therefore will not be explained here in detail. Suffice it to say that, in order to provide current feedback control, it is necessary to precisely identify line currents, $i_a$, $i_b$ and $i_c$, on lines 26, 28 and 30.

According to the present invention, only two currents sensors 22, 24 are required to identify all three lines currents $i_a$, $i_b$ and $i_c$, and to provide complete over-current protection. To this end, sensors 22, 24 are configured with respect to lines 26, 28 and 30 such that first sensor 22 provides a first combined current signal $i_{com1}$ which includes at least currents $i_a$, $i_b$ through lines 26 and 28, second sensor 24 provides a second combined current signal $i_{com2}$ including at least current $i_b$ passing through line 28 and either the first or second sensors 22 or 24 also senses the current $i_c$ passing through line 30. In FIG. 1, it is the second sensor 24 which senses current $i_c$ through line 30. In other words, second sensor 24 senses both currents $i_b$ and $i_c$ through lines 28 and 30, respectively.

As well known in the motor controls art, line currents $i_a$, $i_b$ and $i_c$ when no ground fault is occurring, are related such that:

$$i_a + i_b + i_c = 0 \qquad \text{Eq. 1}$$

Therefore:

$$i_c = -(i_a + i_b) \qquad \text{Eq. 2}$$

And:

$$i_a = -(i_b + i_c) \qquad \text{Eq. 3}$$

Referring still to FIG. 1, line current identifier 18 receives the first and second combined line currents $i_{com1}$ and $i_{com2}$ and uses those signals to identify the three line currents $i_a$, $i_b$ and $i_c$ providing feedback current signals $i_a'$, $i_b'$ and $i_c'$ as outputs. To this end, first combined current $i_{com1}$ is equal to the sum of currents $i_a$ and $i_b$. Similarly, second combined current $i_{com2}$ is equal to the sum of currents $i_b$ and $i_c$. Therefore, referring to Equation 2, current $i_c$ is equal to the negative of the first combined current $i_{com1}$. Similarly, according to Equation 3, current $i_a$ is equal to the negative of the second combined current $i_{com2}$. Thus, identifier 18 automatically identifies currents $i_a$ and $i_c$ according Equations 3 and 2, respectively. Once currents $i_a$ and $i_c$ are identified, identifier 18 determines current $i_b$ according to Equation 1. Specifically, Equation 1 can be rewritten as:

$$i_b = -(i_a + i_c) \quad \text{Eq. 4}$$

Identified currents $i_a$, $i_b$ and $i_c$ are provided as feedback currents $i_a'$, $i_b'$ and $i_c'$ to both controllers 16 and circuitry 20 to facilitate PWM control, ground fault and over-current protection, respectively.

Figure 2:
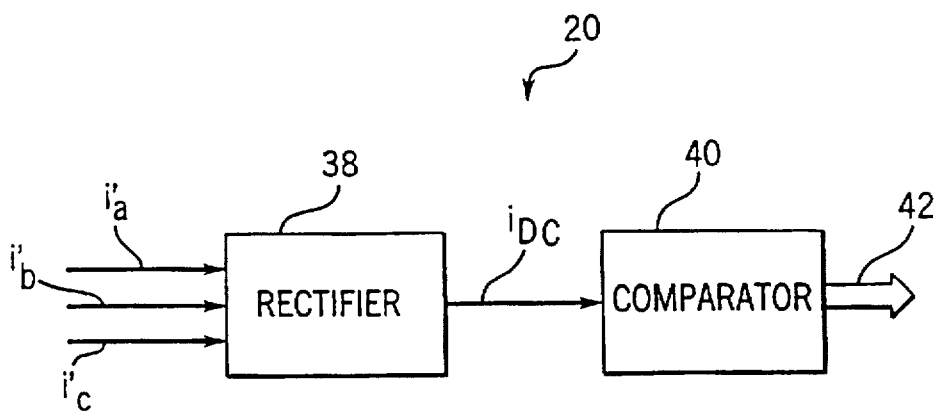
FIG. 2 is a schematic diagram illustrating the over-current and ground fault protection circuitry of FIG. 1.
Figure 3:
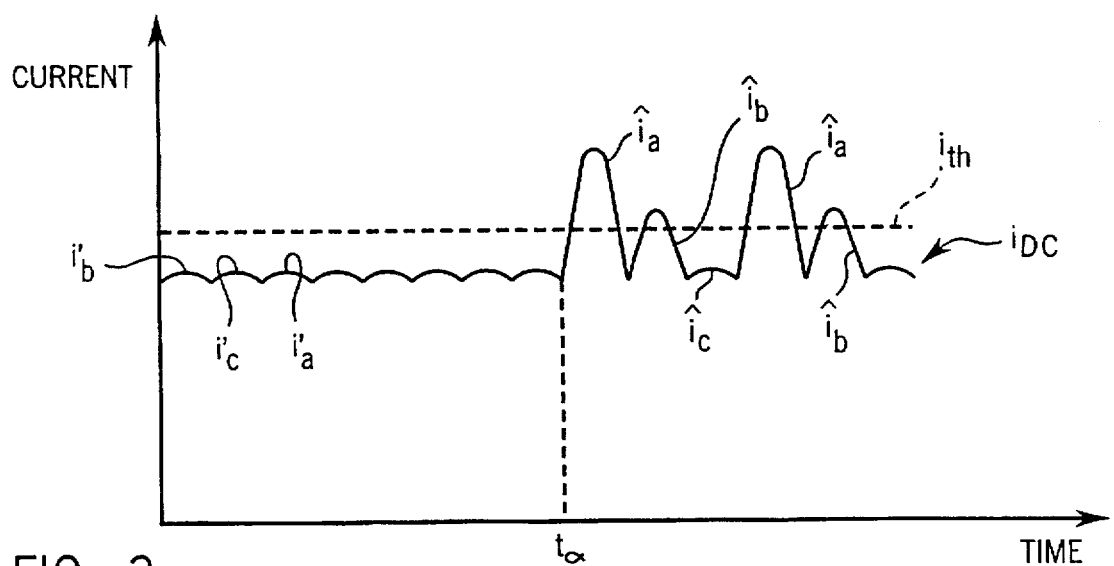
FIG. 3 is a graph showing a current derived by the rectifier of FIG. 2.

Referring now to FIG. 2, circuitry 20 includes a rectifier 38 and a comparator 40. Rectifier 38 receives feedback currents $i_a'$, $i_b'$ and $i_c'$ and fully rectifies those currents providing a DC current $i_{DC}$ to comparator 40. Referring also to FIG. 3, during normal operation without over-current, current $i_{DC}$ as essentially a steady-state amplitude as illustrated prior to time $t_\alpha$.

Comparator 40 receives the DC current $i_{DC}$ and compares the DC current $i_{DC}$ to a threshold current value $i_{TH}$ wherein threshold current value $i_{TH}$ is greater than the DC current $i_{DC}$ and is chosen to reflect typical short circuit or over-current levels of operation. When current value $i_{DC}$ is greater than the threshold value $i_{TH}$, compensator 40 provides an alarm signal via a bus 42 to controller 16 indicating that over-current has occurred on one of the three lines 26, 28 or 30. When over-current occurs controller 16 stops firing the inverter switches thereby shutting off currents $i_a$, $i_b$ and $i_c$ to motor 12.

In operation, as controller 16 and inverter 14 are providing currents $i_a$, $i_b$ and $i_c$ to motor 12, sensors 22 and 24 are sending first and second combined currents $i_{com1}$ and $i_{com2}$ and providing those currents to identifier 18. Identifier 18 identifies feedback currents $i_a'$, $i_b'$ and $i_c'$ as described above and provides those currents to controller 16 and circuitry 20. Circuitry 20 identifies over-current conditions as explained above and when an over-current occurs, provides an alarm signal on line 42 to shut down currents $i_a$, $i_b$ and $i_c$. Referring specifically to FIG. 3, prior to the time $t_\alpha$, current value $i_{DC}$ is less than the threshold value $i_{TH}$ and therefore no over-current condition occurs and normal motor control operation occurs.

However, in the example illustrated, at time $t_\alpha$, a short to ground occurs in line 30 thereby causing current $i_c$ therethrough to increase significantly. When current $i_c$ increases significantly, according to Equation 3, the $i_a$ current calculation will yield an excessive $i_a'$ feedback current. According to Equation 2, because $i_a$ and $i_b$ are not short circuited, neither of those currents will, in reality, be excessive and therefore the $i_c$ current calculation will yield an $i_c$ current segment $\hat{i}_c$ which is not excessive. Thus, after identifier 18 negates the first and second combined currents $i_{com1}$ and $i_{com2}$, feedback current $i_a'$ will yield an excessive segment $\hat{i}_a$ which shows up in the DC current value $i_{DC}$ as an irregularity in excess of the threshold current $i_{TM}$ (see FIG. 3).

In addition, according to Equation 4, because the calculated feedback current $i_a'$ according to Equation 3 is incorrect, the calculated feedback current $i_b'$ will also be incorrect and will therefore be excessive. Referring still to FIG. 3, the resulting current segment $\hat{i}_b$ in the DC current value $i_{DC}$ also exceeds the threshold current $i_{TH}$.

Just after time $t_\alpha$, circuitry 20 identifies the excessive segment $\hat{i}_a$ wherein the DC value $i_{DC}$ exceeds the threshold value $i_{TH}$. At this point, circuitry 20 provides the alarm signal on bus 42 to controller 16 to cut off currents $i_a$, $i_b$ and $i_c$. In this way, despite using only two current sensors 22 and 24, complete over-current protection can be achieved. This is because each of currents $i_a$, $i_b$ and $i_c$ is sensed by at least one of the sensors 22 and 24 and therefore any current irregularity will be reflected in the feedback currents $i_a'$, $i_b'$ and $i_c'$.

It should be noted that the sensor configuration illustrated in FIG. 1 is only one of several configurations which is intended to be covered by the present invention. The important aspect of any sensor configuration in accordance with the present invention is that each of the line currents $i_a$, $i_b$ and $i_c$ be sensed by at least one of the current sensors and that each current sensor provides a combined current signal $i_{com1}$ or $i_{com2}$ from which one of the line currens $i_a$, $i_b$ or $i_c$ can be derived independent of any other operating parameters. In the example above, clearly each line current $i_a$, $i_b$ and $i_c$ is sensed by at least one sensor. In addition, current $i_c$ can be derived solely from the first combined current $i_{com1}$ while current $i_a$ can be derived solely from the second combined current $i_{com2}$. Examples of some other configurations which are contemplated by the present invention are illustrated in FIGS. 4 and 5.

Figure 4:
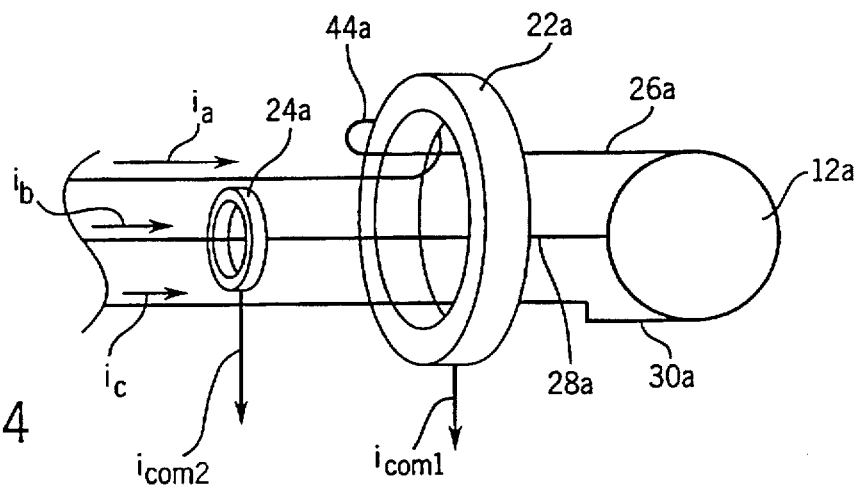
FIG. 4 is a second sensor configuration embodiment according to the present invention.
Figure 5:
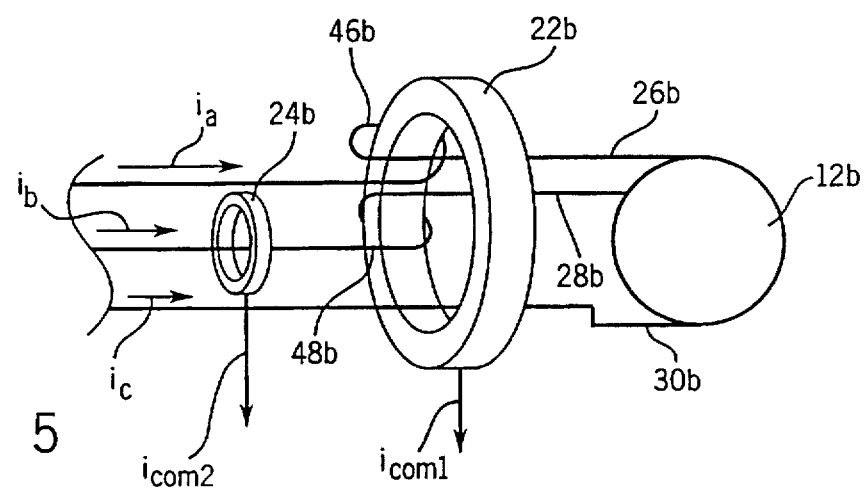
FIG. 5 is a third sensor configuration according to the present invention.

Referring to FIG. 4, in order to simplify this explanation, only motor 12a, sensors 22a and 24a and lines 26a, 28a and 30a are illustrated. Currents $i_a$, $i_b$ and $i_c$ are provided on lines 26a, 28a and 30a. In this example only line 28a passes through second sensor 24a such that sensor 24a only senses current $i_b$. Therefore, in this configuration, identifier 18 (see FIG. 1) would set the feedback current $i_b'$ equal to the second combined signal $i_{com2}$.

Referring still to FIG. 4, each of lines 28a and 30a pass through first sensor 22a once while line 26a forms a single loop 44a around sensor 22a and thereby passes through sensor 22a twice. Sensor 22a senses $i_a + i_b + i_c + i_a$ and therefor, according to Equation 1 the first combined current $i_{com1}$ is equal to line current $i_a$ according to the following equation:

$$i_{com1} = i_a + i_b + i_c + i_a = i_a \quad \text{Eq. 5}$$

An identifier 18 sets feedback current $i_a'$ equal to the first combined current $i_{com1}$. Next, after identifier 18 has identified feedback currents $i_b'$ and $i_a'$, the identifier can use Equation 2 to determine feedback current $i_c'$. The feedback currents $i_a'$, $i_b'$ and $i_c'$ are then provided to the controller 16 and circuitry 20 which operate in the manner described above.

Referring to FIG. 5, again, for simplicity, only motor 12b, first and second sensors 22b, 24b and lines 26b, 28, and 30b are illustrated. Currents $i_a$, $i_b$ and $i_c$ flow through lines 26b, 28b and 30b. In this configuration, once again only line 28b passes through second sensor 24b so that the second combined signal $i_{com2}$ is equal to $i_b$. In this configuration, line 30b passes through first sensor 22b. In addition, each of lines 26b and 28b forms a single loop 46b, 48b, respectively around sensor 22b as they pass therethrough such that each of lines 26b and 28b pass through sensor 22b twice. Thus, sensor 22b provides first combined current $i_{com1}$ as:

$$i_{com2} = i_a + i_a + i_b + i_b + i_c = i_a + i_b \quad \text{Eq. 6}$$

Therefore, according to Equation 2, current $i_c$ is equal to the negative of the first combined current $i_{com1}$. Thus, the configuration of FIG. 5 yields combined current signals $i_{com1}$ and $i_{com2}$ which can easily be used by identifier 18 to determine feedback currents $i_b$ and $i_c$. Next, Equation 3 is used by identifier 18 to determine current $i_a'$. The identified currents are provided as feedback currents $i_a'$, $i_b'$ and $i_c'$ to controller 16 and circuitry 20 which operate as described above.

It should be understood that the methods and apparatuses described above are only exemplary and do not limit the scope of the invention, and that various modifications could be made by those skilled in the art that would fall under the scope of the invention. For example, while only three embodiments are illustrated, clearly, several other embodiments of a two sensor system are contemplated. To this end, referring again to FIG. 5, while sensor 22b provides combined current $i_{com1}$ which can be independently used to identify current $i_c$, instead of having only line 28b pass through sensor 24b, both lines 28b and 30b could pass through sensor 24b so that current $i_{com2}$ is equal to $i_b+i_c$. Then using Equation 3, current $i_a$ can be derived and then identifier 18 can use currents $i_a$ and $i_c$ to derive current $i_b$ according to Equation 4. This is different than in FIG. 5 where signals $i_{com1}$ and $i_{com2}$ are used to identify currents $i_b$ and $i_c$ and then those currents are used according to Equation 3 to identify current $i_a$.

To apprise the public of the scope of this invention, we make the following claims:

I claim:

1. An apparatus for measuring currents in a motor system including first, second and third input lines, each input line linked to a separate one of three motor phases, the apparatus comprising:

a first sensor for sensing a first combined current;

a second sensor for sensing a second combined current; and a calculator using the first and second combined currents to determine first, second and third line currents flowing through the first, second and third lines, respectively;

wherein, each of the three line currents is included in at least one of the combined currents, the first combined current can be used independently to identify one of the first, second, or third line currents and the second combined current can be used independently to identify another of the first, second, or third line currents.

2. The apparatus of claim 1 wherein the first combined current includes at least the first and second line currents, the second combined current includes at least the second line current, and at least one of the first or second combined currents includes the third line current.

3. The apparatus of claim 1 also for providing full over-current and ground fault protection for the motor system wherein the calculator further includes a rectifier and a comparator, the rectifier receives the first, second and third line currents, converts the currents to a DC current value, the comparator compares said DC current value to a threshold value and generates an alarm signal when the DC current value exceeds the threshold value, the threshold value being a predetermined percentage in excess of a steady state DC current value.

4. The apparatus of claim 3 further including an over-current turn off mechanism wherein, when an alarm signal is generated, the turn off mechanism shuts off the first, second and third currents.

5. The apparatus of claim 1 wherein the sensors are hall effect sensors, lines associated with currents being sensed passing through associated sensors.

6. The apparatus of claim 5 wherein all of the lines pass through the first sensor and at least the first line forms at least one loop around the first sensor such that the first line passes through the first sensor at least twice.

7. An apparatus for measuring currents in a motor system including first, second and third input lines, each input line linked to a separate one of three motor phases, the apparatus comprising:

a first sensor for sensing a first combined current;

a second sensor for sensing a second combined current; and a calculator using the first and second combined currents to determine first, second and third line currents flowing through the first, second and third lines, respectively;

wherein, the first combined current only includes the first and second line currents, the second combined current includes only the second and third line currents, and the calculator equates the first line current with the negative of the second combined current, equates the third line current with the negative of the first combined current, and derives the second line current by mathematically combining the first and second line currents.

8. The apparatus of claim 7 wherein the first and third line currents are combined to derive the second line current by setting the second line current equal to the negative of the sum of the first and third line currents.

9. An apparatus for measuring currents in a motor system including first, second and third input lines, each input line linked to a separate one of three motor phases, the apparatus comprising:

a first Hall effect sensor for sensing a first combined current;

a second Hall effect sensor for sensing a second combined current; and a calculator using the first and second combined currents to determine first, second and third line currents flowing through the first, second and third lines, respectively;

wherein, all of the lines pass through the first sensor, of only the first line forms a loop around the first sensor and the first line forms only a single loop such that the first line passes through the first sensor twice, the second line is the only line passing through the second sensor, the calculator equates the first line current with the first combined current and the second line current with the second combined current and determines the third line current by negating the sum of the first and second line currents.

10. An apparatus for measuring currents in a motor system including first, second and third input lines, each input line linked to a separate one of three motor phases, the apparatus comprising:

a first Hall effect sensor for sensing a first combined current;

a second Hall effect sensor for sensing a second combined current; and a calculator using the first and second combined currents to determine first, second and third line currents flowing through the first, second and third lines, respectively;

wherein, all of the lines pass through the first sensor, the first line forms a first loop around the first sensor and the second line forms a second loop around the first sensor such that each of the first and second lines passes through the first sensor twice.

11. The apparatus of claim 10 wherein the second line is the only line which passes through the second sensor and the calculator equates the third line current with the first combined current and the second line current with the second combined current and determines the first line current by negating the sum of the second and third line currents.

12. An apparatus for measuring currents in a motor system including first, second and third input lines, each input line linked to a separate one of three motor phases, the apparatus comprising:

a first sensor for sensing the first and second line currents providing a first combined current;

a second sensor for sensing the second and third line currents providing a second combined current;

a calculator using the first and second combined currents to determine first, second and third line currents flowing through the first, second and third lines, respectively, the calculator equating the first line current with the negative of the second combined current, equating the third line current with the negative of the first combined current and deriving the second line current by mathematically combining the first and second line currents.

13. The apparatus of claim 12 wherein the first and third line currents are combined to derive the second line current by setting the second line current equal to the negative of the sum of the first and third line currents.

* * * * *